United States Patent
Takemura et al.

(10) Patent No.: US 9,406,830 B1
(45) Date of Patent: Aug. 2, 2016

(54) SEMICONDUCTOR LIGHT-RECEIVING DEVICE

(71) Applicant: Mitsubishi Electric Corporation, Tokyo (JP)

(72) Inventors: Ryota Takemura, Tokyo (JP); Masaharu Nakaji, Tokyo (JP); Kazuki Yamaji, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 14/928,485

(22) Filed: Oct. 30, 2015

(30) Foreign Application Priority Data

Mar. 23, 2015 (JP) .................. 2015-059974

(51) Int. Cl.
| | | |
|---|---|---|
| H01L 31/10 | (2006.01) | |
| H01L 31/00 | (2006.01) | |
| H01L 31/107 | (2006.01) | |
| H01L 31/0352 | (2006.01) | |

(52) U.S. Cl.
CPC ...... *H01L 31/107* (2013.01); *H01L 31/035272* (2013.01)

(58) Field of Classification Search
CPC ............... H01L 31/107; H01L 31/035272
See application file for complete search history.

(56) References Cited

U.S. PATENT DOCUMENTS

| | | | | |
|---|---|---|---|---|
| 4,935,795 A | * | 6/1990 | Mikawa | ............... H01L 31/1075 257/437 |
| 6,015,721 A | | 1/2000 | Kim | |
| 7,038,251 B2 | * | 5/2006 | Ishimura | ............... H01L 31/107 257/186 |
| 7,538,367 B2 | * | 5/2009 | Yagyu | ................... H01L 31/107 257/199 |
| 7,719,028 B2 | * | 5/2010 | Yagyu | ............... H01L 31/03046 257/184 |
| 8,008,688 B2 | * | 8/2011 | Hu | ....................... H01L 31/1075 257/186 |
| 2003/0137026 A1 | * | 7/2003 | Park | .................... H01L 31/1075 257/481 |
| 2005/0230706 A1 | * | 10/2005 | Yagyu | ................... H01L 31/107 257/186 |
| 2006/0186501 A1 | * | 8/2006 | Ishimura | ............... H01L 31/107 257/436 |
| 2007/0090397 A1 | | 4/2007 | Nakata et al. | |
| 2013/0154045 A1 | | 6/2013 | Ishibashi et al. | |
| 2013/0168793 A1 | | 7/2013 | Ishibashi et al. | |

FOREIGN PATENT DOCUMENTS

| | | | |
|---|---|---|---|
| JP | 01292870 A | * | 11/1989 |
| JP | H10-284754 A | | 10/1998 |
| JP | 2000-323746 A | | 11/2000 |
| JP | 2008-021725 A | | 1/2008 |
| JP | 2012-054478 A | | 3/2012 |
| JP | 5327892 B2 | | 10/2013 |
| JP | 5497686 B2 | | 5/2014 |
| WO | 2005/078809 A1 | | 8/2005 |

* cited by examiner

*Primary Examiner* — Ida M Soward
(74) *Attorney, Agent, or Firm* — Studebaker & Brackett PC

(57) ABSTRACT

A semiconductor light-receiving device includes: a substrate; a p-type conductive layer, a light absorption layer having a smaller bandgap than that of incident light, a multiplication layer producing avalanche multiplication, and an n-type window layer laminated in that order on the substrate; an n-type conductive layer in a region of part of the n-type window layer; and a first p-type conductive region in a region of the n-type window layer that is not in contact with the n-type conductive layer, wherein the first p-type conductive region does not reach the multiplication layer and is not in contact with any electrode to which power is supplied from outside.

5 Claims, 10 Drawing Sheets

SEMICONDUCTOR LIGHT-RECEIVING DEVICE

BACKGROUND OF THE INVENTION

1. Field of the Invention

The present invention relates to a semiconductor light-receiving device used for optical fiber communication or the like.

2. Background Art

Structures of semiconductor light-receiving devices can be roughly divided into a surface illuminated type in which light is incident from a surface side of an epitaxial growth layer on a semiconductor substrate, an edge illuminated type in which light is incident from a side face of the epitaxial growth layer, and a back-side illuminated type in which light is incident from a semiconductor substrate side.

Generally, semiconductor light-receiving devices can obtain light receiving sensitivity only in a region of PN junction which is built in the structures, and the greater the size, the easier the alignment of light, excelling in mountability. On the other hand, when the PN junction increases in size, the device capacity increases and its time constant increases, which is disadvantageous in terms of high-speed response.

Among the above-described structures of light-receiving devices, the back-side illuminated type structure can easily reduce a parasitic capacitance and can thereby increase the size of PN junction, making it easier to achieve both ease of mounting and speed enhancement by a reduction in the device capacity. The back-side illuminated type structure is therefore a common structure particularly for high-speed communication of 10 Gbps or higher.

Semiconductor light-receiving devices are often manufactured by laminating an undoped light absorption layer and a p-type conductive region in that order on an n-type conductive layer formed on an n-type substrate or semi-insulating substrate. In the semiconductor light-receiving devices, many carriers are generated at a position of the light absorption layer close to the light incident surface. Therefore, in common back-side illuminated type light-receiving devices, many carriers are generated on a side of the light absorption layer close to the substrate. In this case, positive holes having a low drift speed move up to the p-type conductive region, substantially drifting throughout the thickness of the light absorption layer, and therefore the movement of carriers takes time and the high-speed response property deteriorates.

In order to solve this problem, a back-side illuminated type light-receiving device is conceived in which a p-type conductive layer is formed on a semi-insulating substrate, and an undoped light absorption layer and an n-type conductive layer are formed thereon (e.g., see Japanese Patent Publication No. 5327892 and Japanese Patent Publication No. 5497686). In this structure, since many positive holes generated on a side of the light absorption layer close to the substrate drift toward the substrate side, the moving distance becomes shorter and the high-speed response property improves. An example of APD is also conceived which has a floating guard ring not connected to any electrode (e.g., see Japanese Patent Application Laid-Open No. 2008-021725, Japanese Patent Application Laid-Open No. 10-284754 and Japanese Patent Application Laid-Open No. 2012-054478).

SUMMARY OF THE INVENTION

In the back-side illuminated type semiconductor light-receiving device in which a p-type conductive layer is formed on the substrate side, the size of the pn junction to which an electric field is applied is determined by removing part of the n-type conductive layer by etching, but obtaining this electric field constriction effect requires a reduction in the thickness of the layer in the lower part of the etched n-type conductive layer. For this reason, the corner portions resulting from etching the n-type conductive layer exposed to the epitaxial layer surface approach a multiplication layer to which a high electric field is applied. This results in a problem that the electric field is concentrated on the corners, raising concern about deterioration of the device due to a leakage current.

The present invention has been implemented to solve the above-described problems and it is an object of the present invention to provide a semiconductor light-receiving device capable of achieving both high-speed response and suppression of deterioration of the device.

According to the present invention, a semiconductor light-receiving device includes: a substrate; a p-type conductive layer, a light absorption layer having a smaller bandgap than that of incident light, a multiplication layer producing avalanche multiplication, and an n-type window layer laminated in that order on the substrate; an n-type conductive layer in a region of part of the n-type window layer; and a first p-type conductive region in a region of the n-type window layer that is not in contact with the n-type conductive layer, wherein the first p-type conductive region does not reach the multiplication layer and is not in contact with any electrode to which power is supplied from outside.

The present invention improves high-speed response by forming the p-type conductive layer on the substrate side. Forming the first p-type conductive region in part of the n-type window layer can reduce the electric field intensity in the vicinity of the surface and reduce deterioration of the device.

Other and further objects, features and advantages of the invention will appear more fully from the following description.

DETAILED DESCRIPTION OF THE PREFERRED EMBODIMENTS

A semiconductor light-receiving device according to the embodiments of the present invention will be described with reference to the drawings. The same components will be denoted by the same symbols, and the repeated description thereof may be omitted.

Embodiment 1

Figure 1:
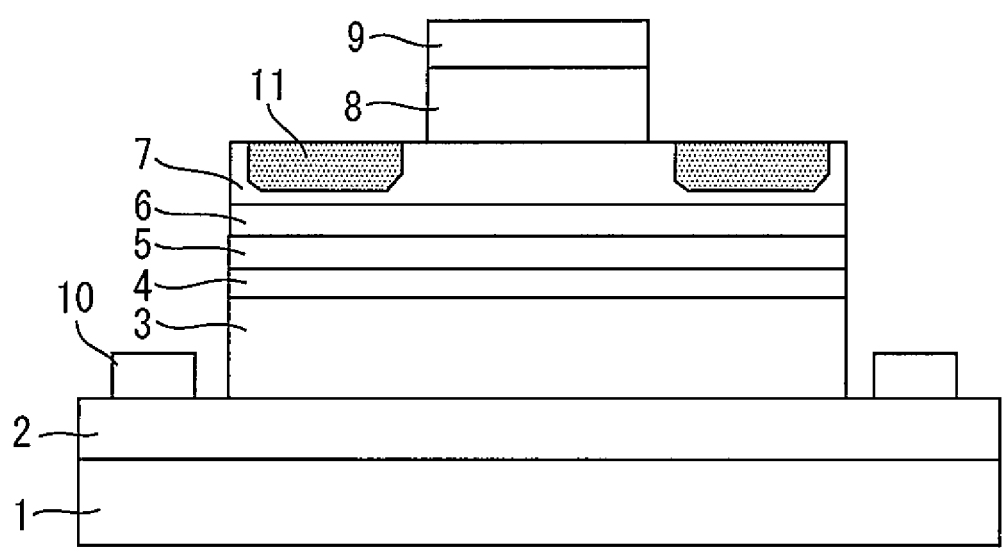
FIG. 1 is a cross-sectional view illustrating a semiconductor light-receiving device according to Embodiment 1 of the present invention.

FIG. 1 is a cross-sectional view illustrating a semiconductor light-receiving device according to Embodiment 1 of the present invention. A p-type InGaAsP contact layer 2, an InGaAs light absorption layer 3 having a smaller bandgap than that of incident light, a p-type InP field controlling layer 4, an AlInAs multiplication layer 5 that produces avalanche multiplication, an n-type AlInAs field controlling layer 6, and an n-type InP window layer 7 are laminated in that order on a semi-insulating InP substrate 1.

An n-type InGaAsP contact layer 8 is formed in a region of part of the n-type InP window layer 7. An n-type electrode 9 is formed so as to contact at least part of the n-type InGaAsP contact layer 8. A p-type electrode 10 is formed so as to contact at least part of the p-type InGaAsP contact layer 2.

In order to determine the pn junction size, part of the n-type InGaAsP contact layer 8 is removed by etching and a peripheral portion of the n-type InP window layer 7 is exposed. A p-type conductive region 11 is formed in a region of this n-type InP window layer 7 that is not in contact with the n-type InGaAsP contact layer 8. The p-type conductive region 11 does not reach the AlInAs multiplication layer 5 and the n-type AlInAs field controlling layer 6 and is not in contact with any electrode to which power can be supplied from the outside.

Note that the side face and the top surface of each epitaxial layer may be covered with a passivation film such as SiN. The light absorption layer may be InGaAsP or the like instead of InGaAs if this is a material having a small bandgap with respect to incident light. AlInAs, AlGaInAs, InGaAsP or the like may be used for the window layer if this is a material having a large bandgap with respect to incident light or InGaAs or the like may be used for the contact layer. InP or AlInAs may be used for the field controlling layer. Any material may be used for each layer if characteristics necessary for operation can be obtained and the range of the material used for description is not limited. A manufacturing method for the p-type conductive region 11 is not particularly limited and the p-type conductive region 11 may be formed using a method such as thermal diffusion or ion implantation.

Figure 2:
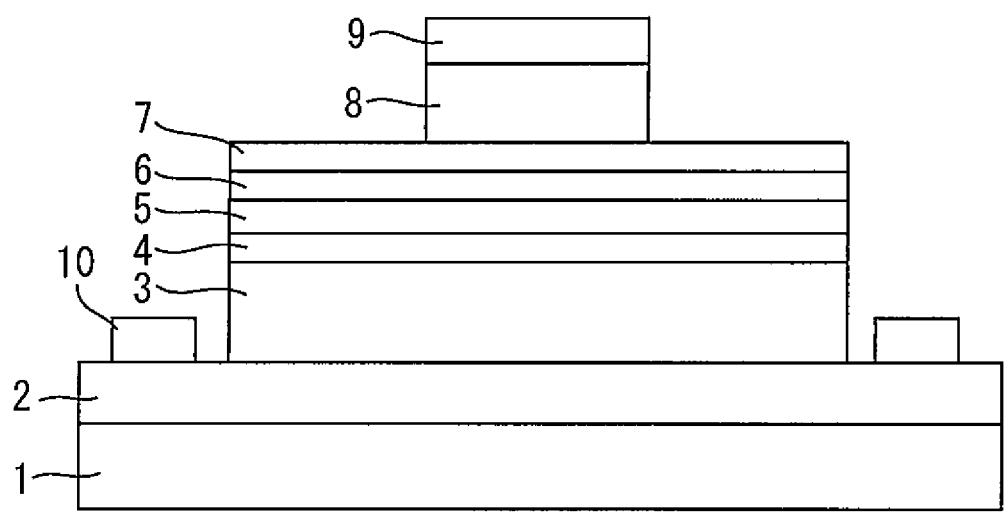
FIG. 2 is a cross-sectional view illustrating a semiconductor light-receiving device according to a comparative example.

Effects of the present embodiment will be described in comparison with a comparative example. FIG. 2 is a cross-sectional view illustrating a semiconductor light-receiving device according to a comparative example. In the comparative example, no p-type conductive region 11 is formed. In order to operate the semiconductor light-receiving device as a high-speed avalanche photodiode, it is necessary to constrict the electric field only to the lower part of the n-type InGaAsP contact layer 8, but in the case of the comparative example, the electric field is constricted by making the n-type InP window layer 7 into a thin film and bringing the AlInAs multiplication layer 5 to which a high electric field is applied closer to the n-type InGaAsP contact layer 8.

Figure 3:
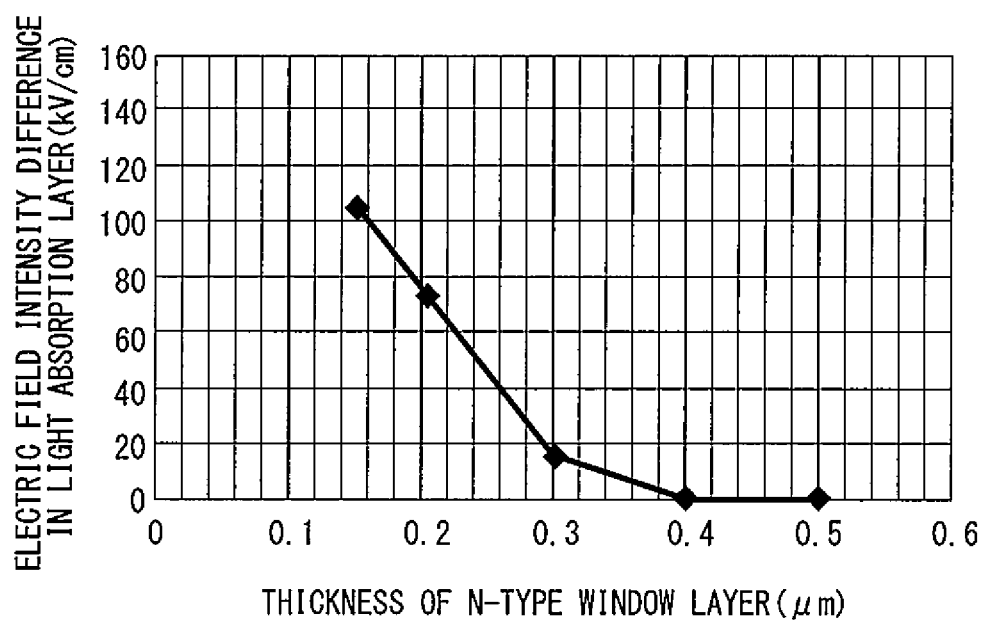
FIG. 3 is a diagram illustrating an electric field intensity difference between a central portion and a peripheral portion of the light absorption layer with respect to the thickness of the n-type window layer according to the comparative example.

FIG. 3 is a diagram illustrating an electric field intensity difference between a central portion and a peripheral portion of the light absorption layer with respect to the thickness of the n-type window layer according to the comparative example. A greater electric field intensity difference means that the electric field is trapped in the InGaAs light absorption layer 3, and it is clear that trapping the electric field only in the lower part of the n-type InGaAsP contact layer 8 needs to set the thickness of the n-type InP window layer 7 to 0.2 μm or less.

Figure 4:
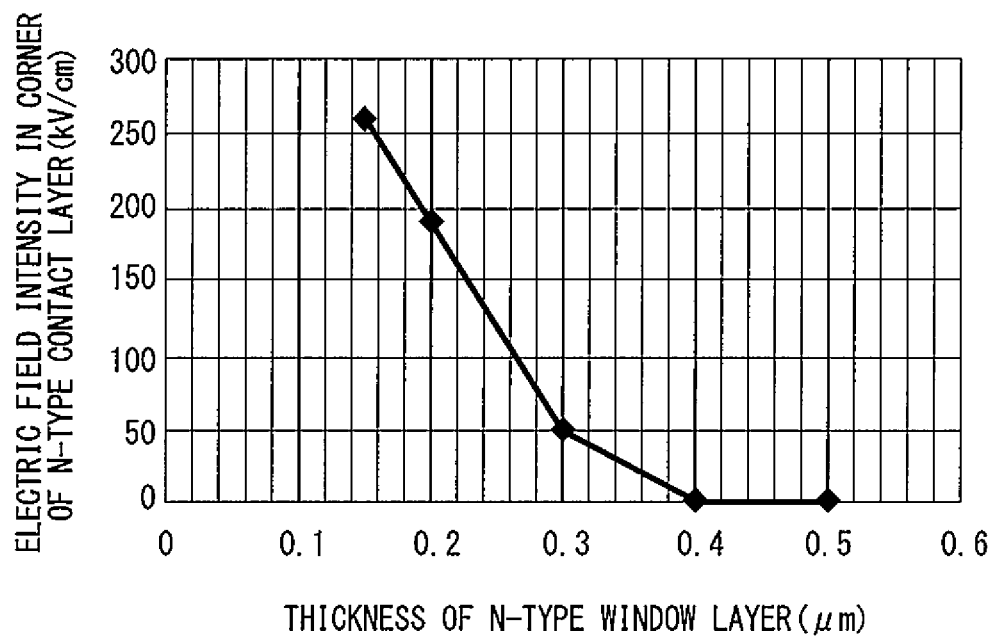
FIG. 4 is a diagram illustrating the electric field intensity in the corners of the n-type contact layer with respect to the thickness of the n-type window layer in the comparative example.

FIG. 4 is a diagram illustrating the electric field intensity in the corners of the n-type contact layer with respect to the thickness of the n-type window layer in the comparative example. A high electric field of approximately 600 kV/cm or higher is applied to the AlInAs multiplication layer 5 during operation of the avalanche photodiode, and when the n-type InP window layer 7 is made into a thin film, a high electric field of approximately 200 kV/cm or higher is applied to the corners of the n-type InGaAsP contact layer 8 and it is clear that there is a high possibility that a leakage current or the like may cause deterioration of the device.

On the other hand, in the present embodiment, since the p-type conductive region 11 is formed in part of the n-type InP window layer 7, a built-in potential on the interface between the n-type InP window layer 7 and the p-type conductive region 11 prevents the electric field from spreading on the p-type conductive region 11 side and causes the electric field to spread in the vertical direction. Thus, the p-type conductive region 11 can constrict the electric field to only the lower part of the n-type InGaAsP contact layer 8. For this reason, the thickness of the n-type InP window layer 7 can be greater than that in the comparative example. However, the farther the p-type conductive region 11 is separated from the n-type InGaAsP contact layer 8, the weaker the electric field constriction effect becomes, and therefore the distance between the two is preferably 3 μm or less.

Figure 5:
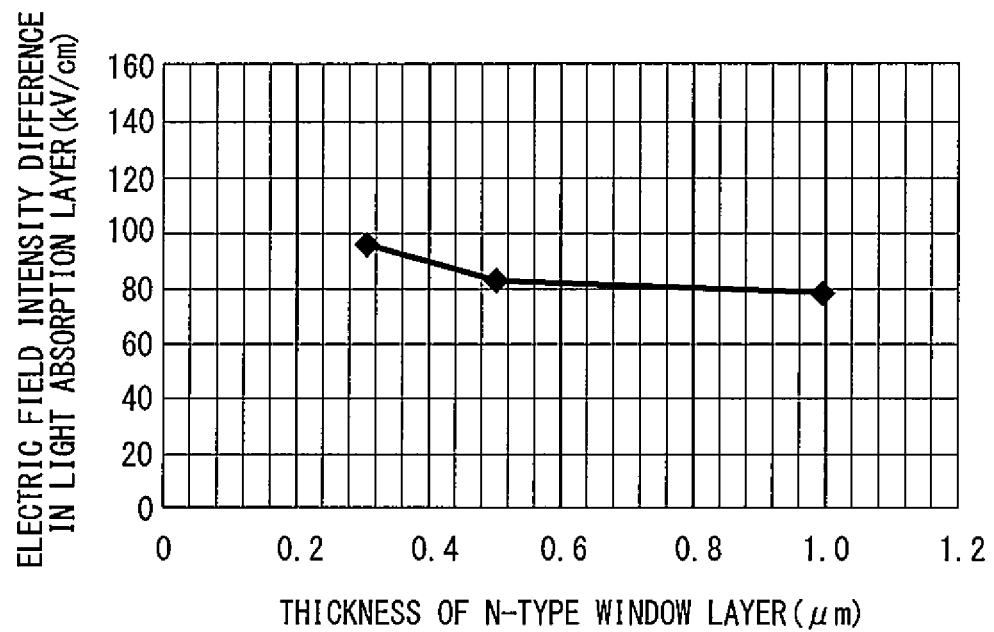
FIG. 5 is a diagram illustrating an electric field intensity difference between a central portion and a peripheral portion of the light absorption layer with respect to the thickness of the n-type window layer according to Embodiment 1.

FIG. 5 is a diagram illustrating an electric field intensity difference between a central portion and a peripheral portion of the light absorption layer with respect to the thickness of the n-type window layer according to Embodiment 1. It is clear that even when the thickness of the n-type InP window layer 7 is increased, the electric field is trapped in the center of the InGaAs light absorption layer 3.

Figure 6:
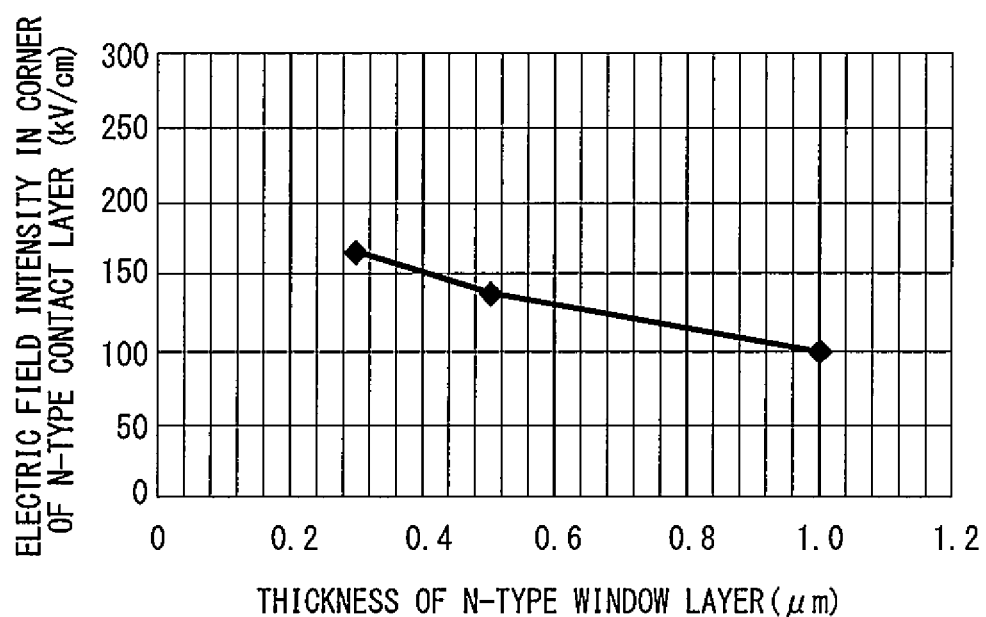
FIG. 6 is a diagram illustrating the electric field intensity in the corners of the n-type contact layer with respect to the thickness of the n-type window layer according to Embodiment 1.

FIG. 6 is a diagram illustrating the electric field intensity in the corners of the n-type contact layer with respect to the thickness of the n-type window layer according to Embodiment 1. When the thickness of the n-type InP window layer 7 is set to, for example, 0.5 μm, the electric field intensity in the corners of the n-type InGaAsP contact layer 8 can be reduced down to approximately 130 kV/cm.

As described above, the present embodiment improves high-speed response by forming the p-type conductive layer on the substrate side. Forming the p-type conductive region 11 in part of the n-type InP window layer 7 can reduce the electric field intensity in the vicinity of the surface and reduce deterioration of the device.

Note that the present embodiment is different from the guard ring in Japanese Patent Application Laid-Open No. 2008-021725, Japanese Patent Application Laid-Open No. 10-284754 and Japanese Patent Application Laid-Open No. 2012-054478 in the following aspects. In Japanese Patent Application Laid-Open No. 2008-021725 and Japanese Patent Application Laid-Open No. 10-284754, a p-type guard ring is formed around the p-type light-receiving section manufactured on the n-type substrate and a reverse bias is applied to the light-receiving section. When the p-type and n-type are switched around in this structure and the p-type layer is formed on the substrate side, this means that an n-type guard ring is formed and it is not possible to obtain the same effect as that of the present embodiment that provides current construction in the p-type region. Moreover, in Japanese Patent Application Laid-Open No. 2012-054478, the area peripheral to the light-receiving region is processed through inactivation or the like by ion implantation, which is different from the structure of the present embodiment in which a p-type region not reaching the n-type field controlling layer is formed.

Embodiment 2

Figure 7:
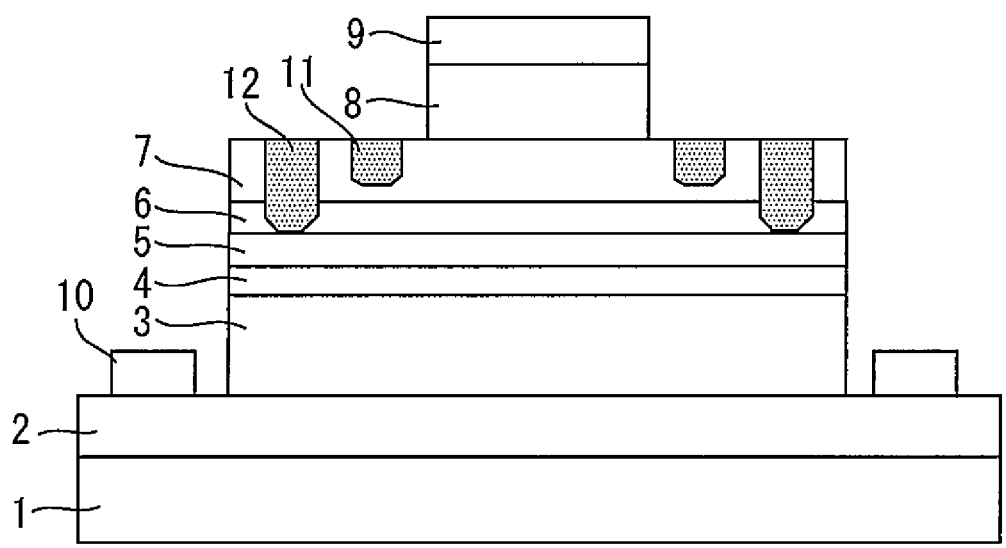
FIG. 7 is a cross-sectional view illustrating a semiconductor light-receiving device according to Embodiment 2 of the present invention.

FIG. 7 is a cross-sectional view illustrating a semiconductor light-receiving device according to Embodiment 2 of the present invention. In the present embodiment, a p-type conductive region 12 is formed in the n-type InP window layer 7 outside the p-type conductive region 11. Although the p-type conductive region 12 is formed up to right above the AlInAs multiplication layer 5, the p-type conductive region 12 does not reach the AlInAs multiplication layer 5 and is not in contact with any electrode to which power can be supplied from the outside. The rest of the configuration is similar to the configuration of Embodiment 1.

The formation of the p-type conductive region 12 can reduce the electric field intensity at an end of the AlInAs multiplication layer 5 in addition to the effect of Embodiment 1 and further improve reliability. Note that when the p-type conductive region 11 is formed up to right above the AlInAs multiplication layer 5, the electric field is concentrated on the corners of the p-type conductive region 11, thus raising concern about deterioration of the device. For this reason, it is effective to form the p-type conductive region in two-stage depth as in the case of the present embodiment.

Embodiment 3

Figure 8:
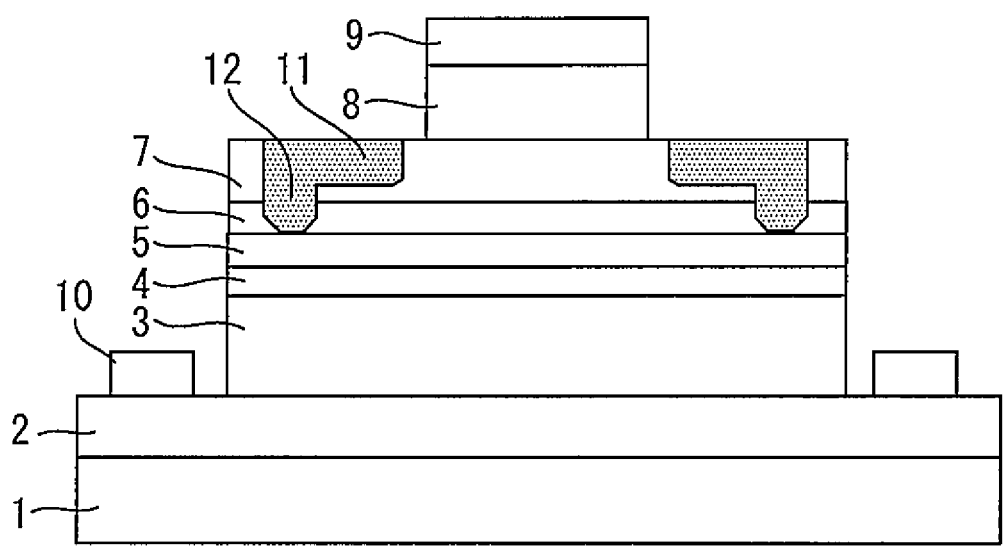
FIG. 8 is a cross-sectional view illustrating a semiconductor light-receiving device according to Embodiment 3 of the present invention.

FIG. 8 is a cross-sectional view illustrating a semiconductor light-receiving device according to Embodiment 3 of the present invention. In the present embodiment, the p-type conductive regions 11 and 12 are connected together. In this way, if the p-type conductive region is formed in two-stage depth, an effect similar to that of Embodiment 2 can be obtained even when the p-type conductive region is not divided.

Embodiment 4

Figure 9:
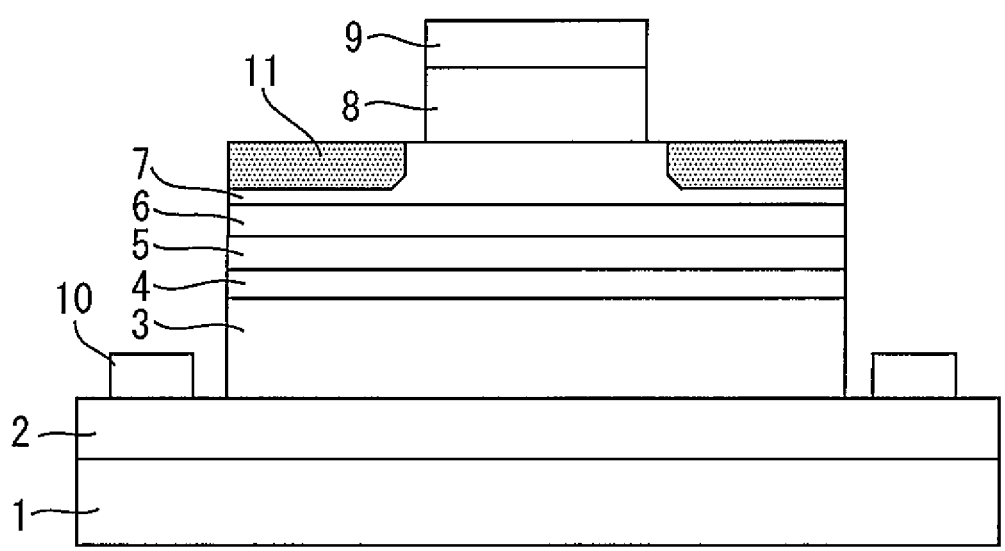
FIG. 9 is a cross-sectional view illustrating a semiconductor light-receiving device according to Embodiment 4 of the present invention.

FIG. 9 is a cross-sectional view illustrating a semiconductor light-receiving device according to Embodiment 4 of the present invention. In the present embodiment, the p-type conductive region 11 is formed up to an outer end of the n-type InP window layer 7. The rest of the configuration is similar to the configuration of Embodiment 1. Effects similar to those of Embodiment 1 can be obtained in this case, too. Note that the p-type conductive region 11 can also be formed up to an outer end of the n-type InP window layer 7 in Embodiments 2 and 3 and similar effects can be obtained.

Embodiment 5

Figure 10:
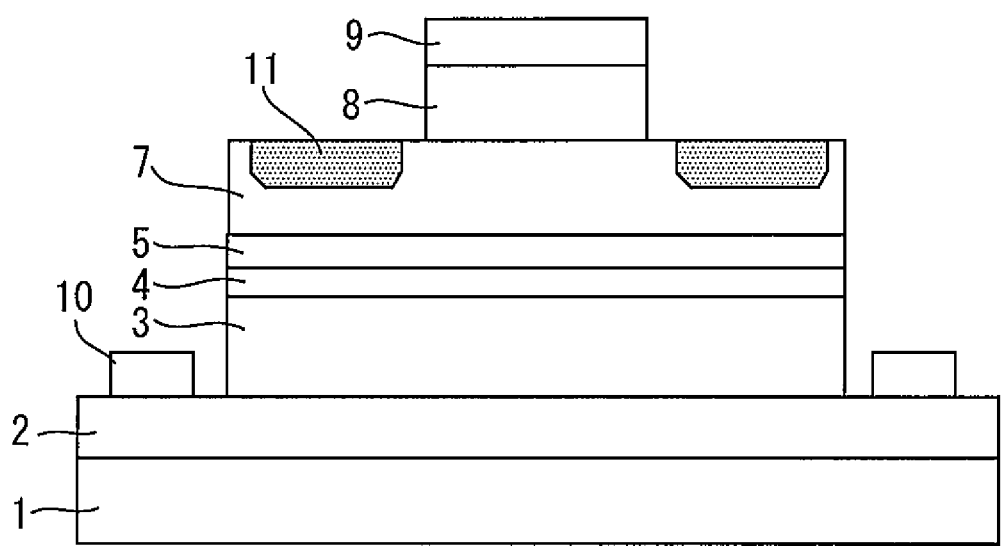
FIG. 10 is a cross-sectional view illustrating a semiconductor light-receiving device according to Embodiment 5 of the present invention.

FIG. 10 is a cross-sectional view illustrating a semiconductor light-receiving device according to Embodiment 5 of the present invention. In Embodiment 1, the n-type AlInAs field controlling layer 6 is formed between the AlInAs multiplication layer 5 and the n-type InP window layer 7, but the n-type AlInAs field controlling layer 6 does not exist in the present embodiment. The rest of the configuration is similar to the configuration of Embodiment 1. Effects similar to those of Embodiment 1 can be obtained in this case, too. Note that the n-type AlInAs field controlling layer 6 can also be omitted in Embodiments 2 to 4 and similar effects can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-059974, filed on Mar. 23, 2015 including specification, claims, drawings and summary, on which the Convention priority of the present application is based, is incorporated herein by reference in its entirety.

What is claimed is:

1. A semiconductor light-receiving device comprising:
  a substrate;
  a p-type conductive layer, a light absorption layer having a smaller bandgap than that of incident light, a multiplication layer producing avalanche multiplication, and an n-type window layer laminated in that order on the substrate;
  an n-type conductive layer in a region of part of the n-type window layer; and
  a first p-type conductive region in a region of the n-type window layer that is not in contact with the n-type conductive layer,
  wherein the first p-type conductive region does not reach the multiplication layer and is not in contact with any electrode to which power is supplied from outside.

2. The semiconductor light-receiving device of claim 1, further comprising a n-type field controlling layer provided between the multiplication layer and the n-type window layer, wherein the first p-type conductive region does not reach the n-type field controlling layer.

3. The semiconductor light-receiving device of claim 1, further comprising a second p-type conductive region in the n-type window layer outside the first p-type conductive region,
  wherein the second p-type conductive region does not reach the multiplication layer and is not in contact with any electrode to which power can be supplied from outside.

4. The semiconductor light-receiving device of claim 3, wherein the first and second p-type conductive regions are connected together.

5. The semiconductor light-receiving device of claim 1, wherein the first p-type conductive region is formed up to an outer end of the n-type window layer.

* * * * *